(12) United States Patent
Lee

(10) Patent No.: US 7,592,664 B2
(45) Date of Patent: Sep. 22, 2009

(54) NONVOLATILE MEMORY STRUCTURE AND METHOD OF FORMING THE SAME

(75) Inventor: Woon Kyung Lee, Gyeonggi-Do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 112 days.

(21) Appl. No.: 11/653,865

(22) Filed: Jan. 17, 2007

(65) Prior Publication Data

US 2008/0061348 A1    Mar. 13, 2008

(30) Foreign Application Priority Data

Sep. 8, 2006    (KR) .................... 10-2006-0086967

(51) Int. Cl.
*H01L 29/76*    (2006.01)
*H01L 29/788*    (2006.01)

(52) U.S. Cl. ...................................... 257/315; 257/316

(58) Field of Classification Search ......... 257/314–324, 257/E29.134
See application file for complete search history.

(56) References Cited

U.S. PATENT DOCUMENTS

| 5,225,700 | A | * | 7/1993 | Smayling | .................. 257/321 |
|---|---|---|---|---|---|
| 5,900,661 | A | * | 5/1999 | Sato | .......................... 257/315 |
| 6,313,498 | B1 | * | 11/2001 | Chen | .......................... 257/316 |
| 6,555,434 | B2 | | 4/2003 | Koh | |
| 6,605,506 | B2 | | 8/2003 | Wu | |
| 6,750,505 | B2 | | 6/2004 | Bez et al. | |
| 2003/0197219 | A1 | | 10/2003 | Kim et al. | |
| 2004/0238881 | A1 | | 12/2004 | Ozawa | |

FOREIGN PATENT DOCUMENTS

| JP | 06-291329 | 10/1994 |
|---|---|---|
| JP | 2004-349650 | 12/2004 |
| KR | 1020030083443 A | 10/2003 |

* cited by examiner

*Primary Examiner*—Cuong Q Nguyen
(74) *Attorney, Agent, or Firm*—Harness, Dickey & Pierce, P.L.C.

(57) ABSTRACT

Example embodiments are directed to a method of forming a nonvolatile memory structure and a nonvolatile memory structure including a plurality of charge storage patterns, wherein an electrical coupling distance (Lc) between adjacent charge storage patterns is larger than a direct geometric distance (Ls) between adjacent charge storage patterns.

19 Claims, 16 Drawing Sheets

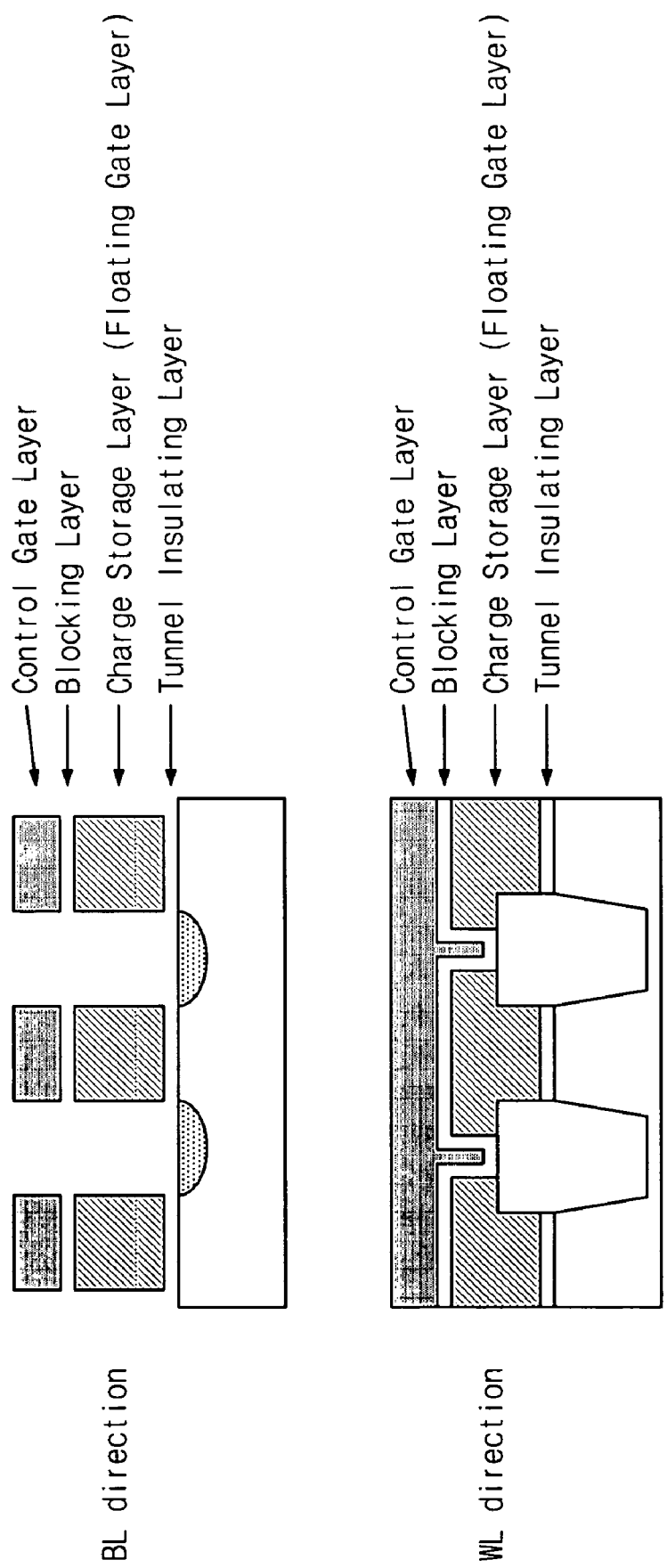

NONVOLATILE MEMORY STRUCTURE AND METHOD OF FORMING THE SAME

PRIORITY STATEMENT

This application claims priority under 35 USC § 119 to Korean Patent Application No. 10-2006-0086967 filed on Sep. 8, 2006, the contents of which are herein incorporated by reference in their entirety for all purposes.

BACKGROUND

1. Field

Example embodiments relate to a storage device, for example, to a device and a method for manufacturing a non-volatile and electrically erasable semiconductor memory device, for example, a flash memory.

2. Description of the Related Art

Non-volatile memory retains information stored in its memory cells even when no power is supplied. Examples include mask ROM, EPROM, and EEPROM.

Non-volatile memory is widely used in various electronic products, for example, personal computers, personal digital assistants (PDAs), cellular phones, digital still cameras, digital video cameras, video game players, memory cards, and other electronic devices.

Memory cards types may include multimedia cards (MMC), secure digital (SD) cards, compact flash cards, memory sticks, smart media cards, and extreme digital (xD) picture cards.

Among non-volatile memory devices, a flash memory is widely used. Flash memory may be divided into a Not-OR (NOR) type and a Not-AND (NAND) type based on a connection structure of cells and bit lines. Because a read speed is faster and a write operation is slower, a NOR-type flash memory may be used as a code memory. Because a write speed is faster and a price per unit area is lower, a NAND-type flash memory may be used as a mass storage device. In order to write data in a flash memory, an erase operation is performed first, and the flash memory may have such a characteristic that an erase unit is larger than a write unit.

Program and erase operations are fundamental operations of a NAND device and are illustrated in FIGS. 1a and 1b, respectively. As shown in FIGS. 1a and 1b, a high electric field may be generated between a floating gate and a channel region. As charge moves through the tunneling oxide in one direction or the other, the threshold voltage (Vth) of the memory cell is changed A read operation is also a fundamental operation of a NAND device. As shown in FIG. 1c, a control gate and a substrate are connected to ground. If a cell is a programmed cell, (Vth>0), the cell is off and the data value is 0. If a cell is an erased cell, (Vth<0), the cell is on and the data value is 1.

FIG. 2a illustrates a schematic and plan view of conventional NAND flash memory cells, including a string select line (SSL), a ground select line (GSL), a common source line (CSL), direct contacts (DC), a plurality of word lines (WL), a plurality of bit lines (BL), a charge storage layer (SA), active regions 113, and isolation regions 115.

FIG. 2b illustrates a vertical view of conventional NAND flash memory cells in a bit line (BL) direction and in a word line (WL) direction. The conventional NAND flash memory cells may include a tunnel insulating layer, a charge storage layer, a blocking layer, and/or a control gate layer. The charge storage layer may be floating gate layer. Floating gate interference may be defined as a Vth shift of a cell proportional to a Vth change of adjacent cells. The charge storage layer may be also be a charge trap layer.

FIG. 2c illustrates a vertical view of a conventional flash memory cell in the WL direction and FIG. 2d illustrates a cross-sectional view of line A-A' in FIG. 2c. As shown, a conventional flash memory cell may include a substrate 11, active regions 13, isolation regions 15, a tunnel insulation layer 31, a floating gate 32, a blocking insulation layer 34, and a control gate 35.

As the size of memory cells is further reduced, a distance between floating gates 32 becomes shorter. The shorter the distance of the floating gates 32 becomes, the larger parasitic capacitances (C) become. Also, because boundaries of adjacent floating gates 32 may face each other (as shown in FIG. 2d), the parasitic capacitances (C) may be increased.

SUMMARY

Example embodiments reduce or minimize parasitic capacitance between memory cells.

Example embodiments are directed to a nonvolatile memory structure including a plurality of charge storage patterns, wherein an electrical coupling distance (Lc) between adjacent charge storage patterns is larger than a direct geometric distance (Ls) between adjacent charge storage patterns.

In example embodiments, at least one of the plurality of charge storage patterns having a width $W_1$ in a bit line direction, the nonvolatile memory structure further including a control gate including a plurality of upper control gates having a lower surface above an upper surface of the plurality of charge storage patterns and a plurality of lower control gates below the plurality of upper control gates, at least one of the lower control gates having a width $W_2$ in the bit line direction, where $W_2 > W_1$.

In example embodiments, a substantial percentage of the plurality of charge storage patterns having a width $W_1$ in a bit line direction and a substantial percentage of the at least one of the lower control gates having a width $W_2$ in the bit line direction, where $W_2 > W_1$.

In example embodiments, a sidewall of at least one of the plurality of lower control gates has a positive gradient.

In example embodiments, the positive gradient is curved, straight, and/or stepped.

In example embodiments, a sidewall of at least one of the plurality of lower control gates and a sidewall of at least one of the plurality of charge storage patterns have different gradients.

In example embodiments, a sidewall of at least one of the plurality of charge storage patterns is more perpendicular than a sidewall of at least one of the plurality of lower control gates.

In example embodiments, a sidewall of at least one of the plurality of lower control gates protrudes with respect to a sidewall of at least one of the plurality of charge storage patterns which prevents the sidewall of the at least one of the plurality of charge storage patterns from facing a sidewall of an adjacent charge storage pattern.

In example embodiments, the sidewall of the at least one of the plurality of lower control gate protrudes with respect to a mask pattern used to form the plurality of upper control gates.

In example embodiments, the lower gate protrusion is of spacer type.

In example embodiments, a sidewall of at least one of the plurality of charge storage patterns is recessed with respect to a sidewall of at least one of the plurality of lower control gates which prevents the sidewall of the at least one of the plurality of charge storage patterns from facing a sidewall of an adjacent charge storage pattern.

In example embodiments, the sidewall of the at least one of the plurality of lower control gate is recessed with respect to a mask pattern used to form the plurality of upper control gates.

In example embodiments, the nonvolatile memory structure further includes a substrate including active regions below the plurality of charge storage patterns and isolation regions below and between the plurality of charge storage patterns, a tunnel insulation layer on the active regions; and a blocking insulation layer on the plurality of charge storage patterns and the isolation regions.

In example embodiments, the nonvolatile memory structure further includes a mask layer on the plurality of upper control gates.

In example embodiments, the substrate is a bulk Si substrate, a Silicon-on-Insulator (SOI) substrate or a stacked-type substrate.

In example embodiments, the blocking insulation layer is one of silicon oxide, silicon nitride, Hafnium aluminate, HfAlO, HfAlON, Hafnium silicate, HfSiO, and HfSiON.

In example embodiments, the plurality of charge storage patterns are dot layers, charge trap layers, or conductive layers.

In example embodiments, the control gate is made of polysilicon or polysilicon and a metal silicide.

In example embodiments, a doping concentration of the plurality of charge storage patterns is greater than a doping concentration of the control gate.

Example embodiments are directed to a method of manufacturing a nonvolatile memory structure including forming a plurality of charge storage patterns, wherein an electrical coupling distance (Lc) between the plurality of charge storage patterns is larger than a direct geometric distance (Ls) between the plurality of charge storage patterns.

In example embodiments, at least one of the plurality of charge storage patterns having a width $W_1$ in a bit line direction, the method further including forming a control gate including a plurality of upper control gates having a lower surface above an upper surface of the plurality of charge storage patterns and a plurality of lower control gates below the plurality of upper control gates, at least one of the lower control gates having a width $W_2$ in the bit line direction, where $W_2>W_1$.

In example embodiments, forming the control gate includes forming a blocking insulating layer on the plurality of charge storage patterns, forming a control gate layer on the blocking insulating layer, forming a mask pattern on the control gate layer, and etching the control gate layer using the mask pattern to form the plurality of upper control gates and to form the plurality of lower control gates.

In example embodiments, forming the plurality of charge storage patterns includes forming a pad oxide layer on a substrate, forming a mask pattern on the pad oxide layer, etching the substrate to form trenches defining active regions, filling the trenches to form isolation regions, removing the mask pattern and the pad oxide layer to expose the active regions, forming a tunneling insulation layer on the exposed active regions, forming the plurality of charge storage patterns on the tunneling insulation layer.

In example embodiments, etching the control gate layer includes etching the control gate layer until the blocking insulation layer is exposed, polymer etching to expose a sidewall of the plurality of upper control gates and an upper side of the control gate layer and etching the control gate layer with an etching gas.

In example embodiments, the method further includes repeating the polymer etching and etching the control gate layer with the etching gas.

In example embodiments, the etching gas includes carbon.

In example embodiments, the plurality of charge storage patterns are a plurality of floating gates, forming the plurality of floating gates including forming a gate oxide layer, a polysilicon layer, and a nitride layer on a substrate, patterning the gate oxide layer, the polysilicon layer, and the nitride layer to form a nitride pattern, a floating gate pattern, including the plurality of floating gates, and a gate oxide layer pattern, etching exposed portions of the substrate to form trenches defining active regions, forming a trench oxide layer in the trenches, filling the trenches with a field oxide to form isolation regions.

In example embodiments, forming the control gate includes forming a dielectric interlayer on the plurality of floating gates, forming a control gate layer on the dielectric interlayer, forming a mask pattern on the control gate layer, and etching the control gate layer using the mask pattern to form the plurality of upper control gates and to form the plurality of lower control gates.

In example embodiments, patterning the polysilicon layer to form the floating gate pattern includes doping the polysilicon layer with impurities at a first concentration level and forming the control gate layer includes doping the control gate layer with impurities at a second concentration level, wherein the second concentration level is greater than the first concentration level.

In example embodiments, etching the control gate layer using the mask pattern to form the plurality of upper control gates and to form the plurality of lower control gates includes etching the control gate layer at a plurality of different etching rates.

In example embodiments, the plurality of charge storage patterns are a charge trap layer, forming the charge trap layer including forming a tunneling layer, a memory storage layer, and a blocking layer on the substrate, patterning the tunneling layer, the memory storage layer, and the blocking layer to form a tunneling pattern, a memory storage pattern, including the charge trap layer, and a blocking layer pattern, implanting ions in exposed portions of the substrate to form a source region and a drain region.

Example embodiments are directed to a method of manufacturing a nonvolatile memory structure including forming a pad oxide layer on a substrate, forming a mask pattern on the pad oxide layer, etching the substrate to form trenches defining active regions, filling the trenches to form isolation regions, removing the mask pattern and the pad oxide layer to expose the active regions, forming a tunneling insulation layer on the exposed active regions, forming a plurality of charge storage patterns on the tunneling insulation layer, wherein an electrical coupling distance (Lc) between the plurality of charge storage patterns is larger than a direct geometric distance (Ls) between the plurality of charge storage patterns, at least one of the plurality of charge storage patterns having a width $W_1$ in a bit line direction, forming a blocking insulating layer on the plurality of charge storage patterns, forming a control gate layer on the blocking insulating layer, forming a mask pattern on the control gate layer, etching the control gate layer using the mask pattern to form a plurality of upper control gates and to form a plurality of lower control gates, the plurality of upper control gates having a lower surface above an upper surface of the plurality of charge storage patterns and the plurality of lower control gates below the plurality of upper control gates, at least one of the lower control gates having a width $W_2$ in the bit line direction, where $W_2 > W_1$.

BRIEF DESCRIPTION OF THE DRAWINGS

The above and other features and advantages of example embodiments will become more apparent by describing them in detailed with reference to the accompanying drawings.

FIG. 2b illustrates a vertical view of conventional NAND flash memory cells in a bit line (BL) and word line (WL) direction.

FIG. 3b illustrates a cross-sectional view of line I-I' line in FIG. 3a.

FIG. 3c illustrates an example cross-sectional view of plane A in FIG. 3a.

DETAILED DESCRIPTION

Figure 1A:
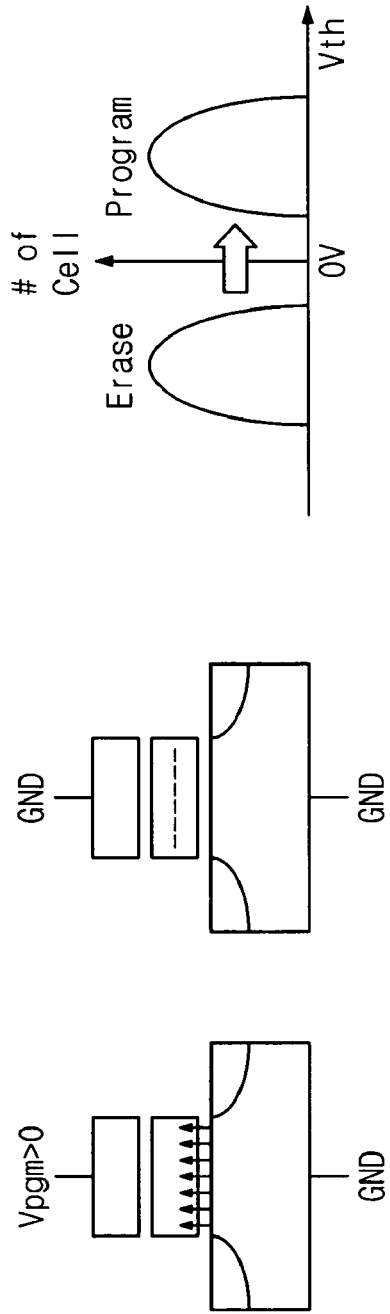
FIGS. 1a, 1b, and 1c illustrate program, erase and read operations, respectively, of a conventional NAND device.
Figure 1B:
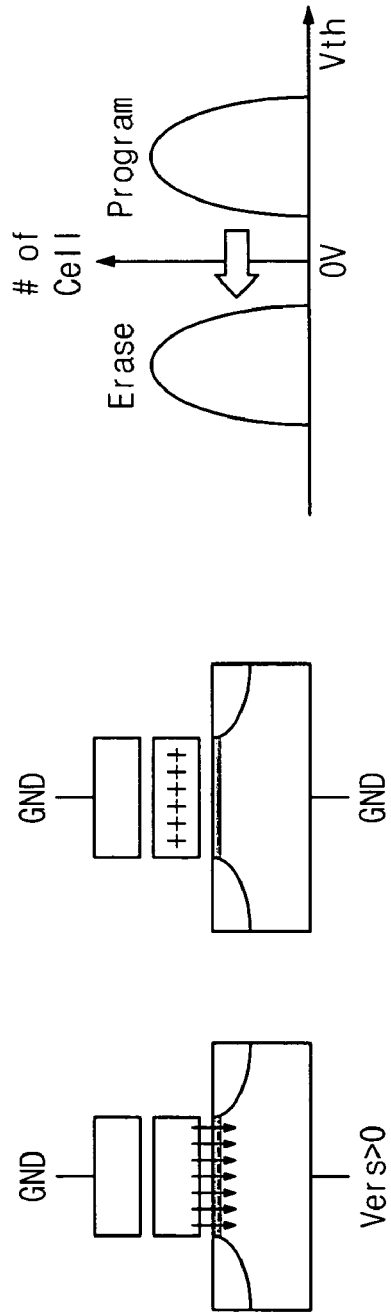
Figure 1C:
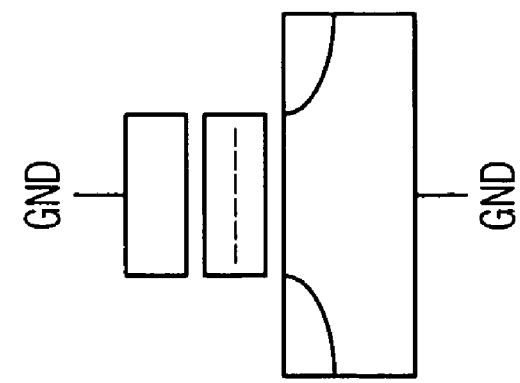
Figure 1C:
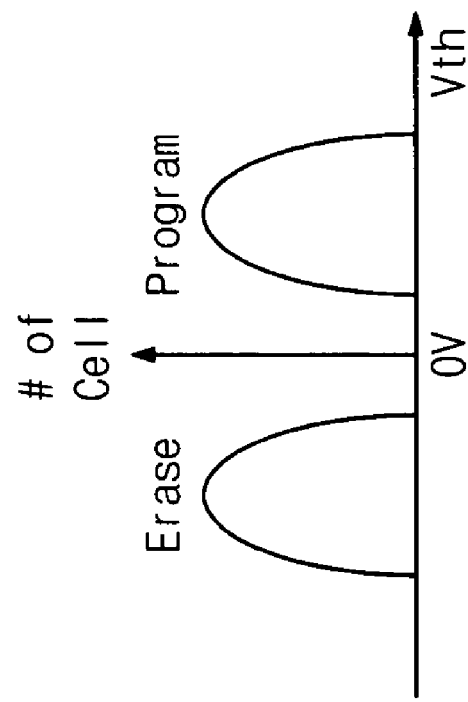
Figure 1C:
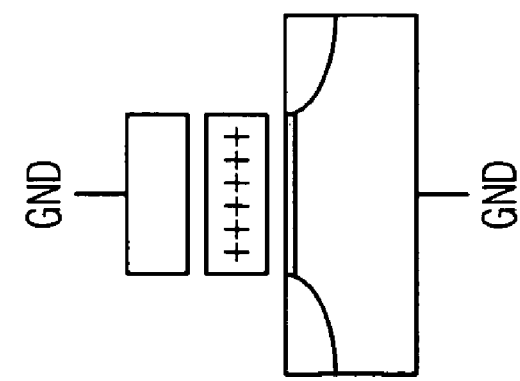

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the claims.

Figure 3A:
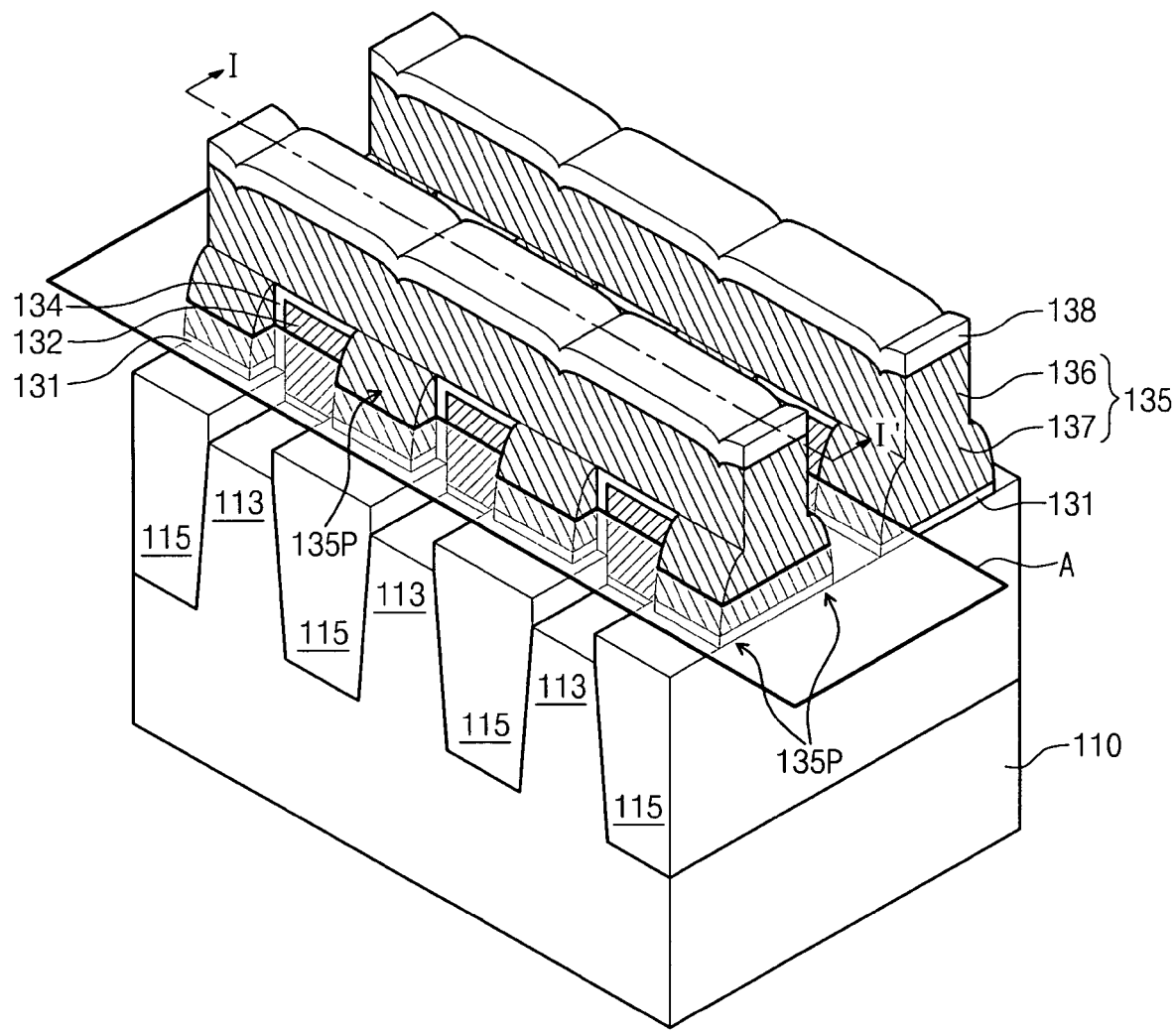
FIG. 3a illustrates a perspective view of a nonvolatile memory structure in accordance with example embodiments.
Figure 3B:
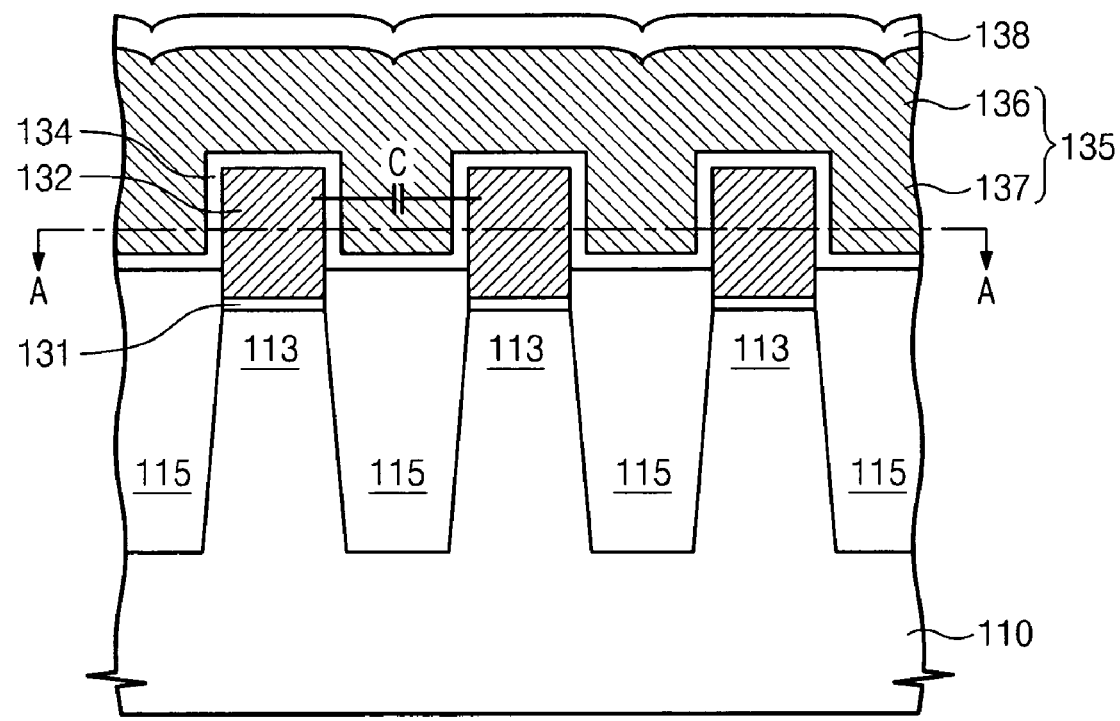

FIG. 3a illustrates a perspective view of a nonvolatile memory structure in accordance with example embodiments. FIG. 3b illustrates a cross-sectional view of line I-I' line in FIG. 3a. As shown, the nonvolatile memory structure may include a substrate 110, active regions 113, isolation regions 115, a tunnel insulation layer 131, charge storage patterns 132, a blocking insulation layer 134, a control gate 135, a protrusion region 135p, and/or a mask pattern 138. The control gate 135 may include an upper control gate 136 and a lower control gate 137.

Figure 3C:
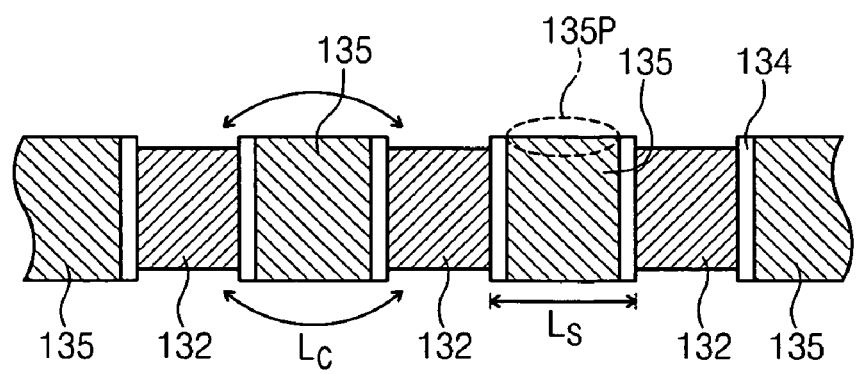

FIG. 3c illustrates a cross-sectional view of plane A in FIG. 3a, including the charge storage patterns 132, the blocking layer 134, and/or the control gate 135, where Lc represents coupling distance and Ls represents direct geometric distance. Lc may be defined as a minimum distance of electrically interferential path between the adjacent charge storage patterns.

To reduce or minimize the capacitance which may cause cell interference, a coupling distance (Lc) between charge storage patterns 132 may be larger than a direct geometric distance (Ls) between charge storage patterns 132, that is:

Lc>Ls

As shown in FIG. 3c, Lc>Ls.

As shown, in example embodiments, the upper control gate 136 may have a higher bottom surface than a top surface of the charge storage patterns 132. As shown, in example embodiments, the lower control gate 137 may be located under the upper control gate 136. As shown, in example embodiments, a sidewall of the lower control gate 137 may have a positive gradient. In example embodiments, the positive gradient may be curved, straight, and/or stepped.

In example embodiments, a doping concentration of the charge storage patterns 132 is greater than a doping concentration of the control gate 135.

In example embodiments, a sidewall of the lower control gate 137 and a sidewall of the charge storage patterns 132 may have different gradients. In example embodiments, the gradient of the sidewall of the charge storage patterns 132 may be more perpendicular than that of the sidewall of the lower control gate 137.

Figure 2A:
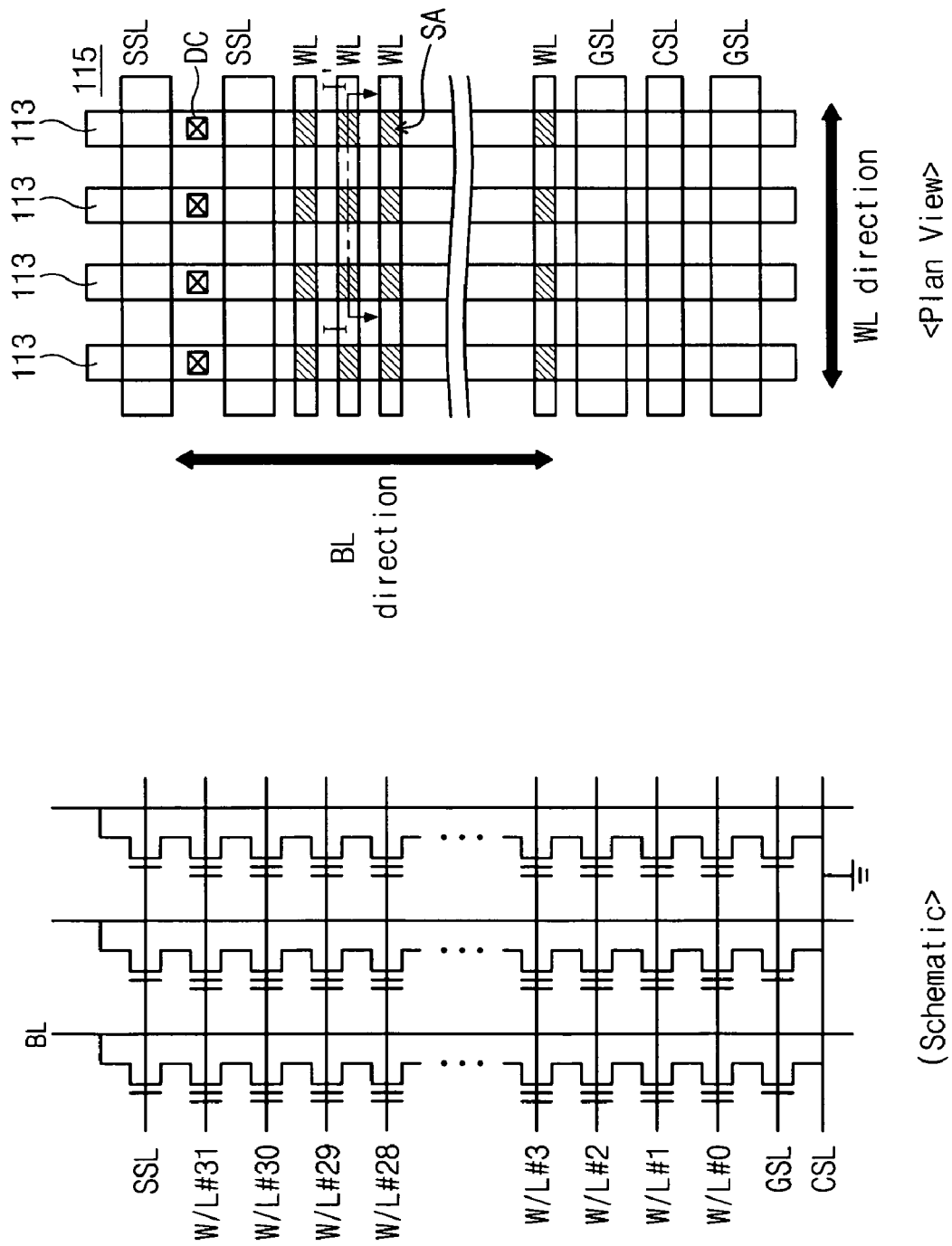
FIG. 2a illustrates a schematic and plan view of conventional NAND flash memory cells.
Figure 2C:
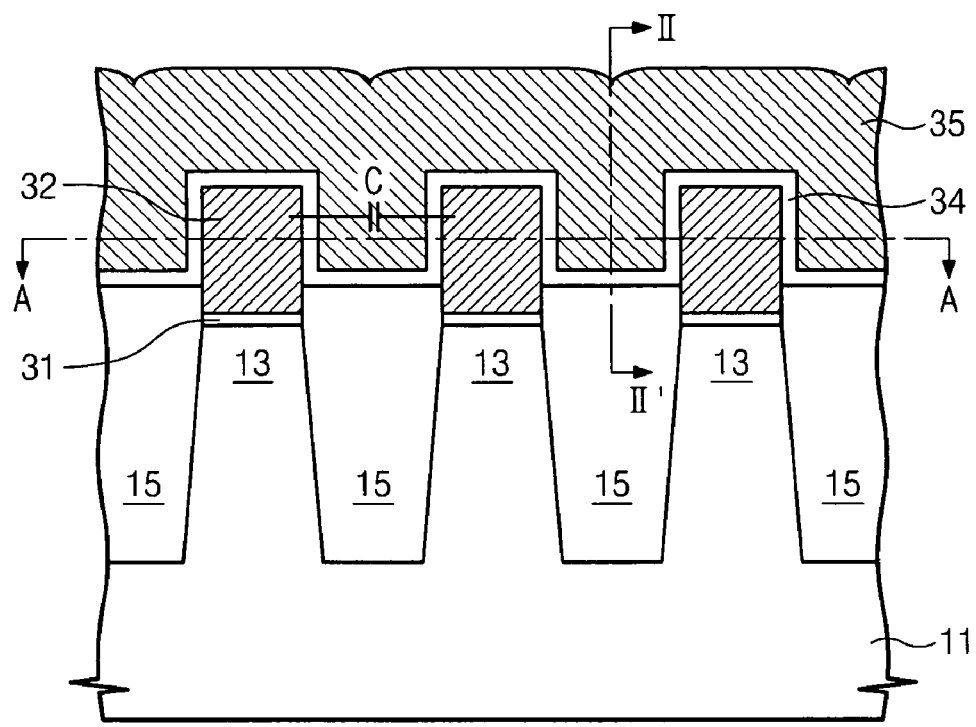
FIG. 2c illustrates a vertical view of a conventional flash memory cell in the WL direction.
Figure 2D:
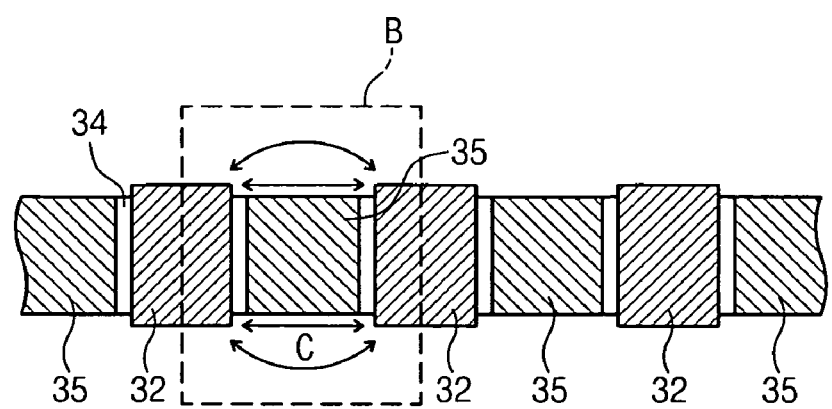
FIG. 2d illustrates a cross-sectional view of line A-A' in FIG. 2c.

In example embodiments, the control gate 135 may include a protrusion part 135p that prevents edges of adjacent charge storage patterns 132 from facing each other, as shown in FIG. 2d. In example embodiments, the protrusion part 135p may be a spacer type.

More generally, in example embodiments, a width of the charge storage patterns 132 may be smaller than that of the control gate 135. In other example embodiments, the charge storage patterns 132 may be recessed.

Figure 4A:
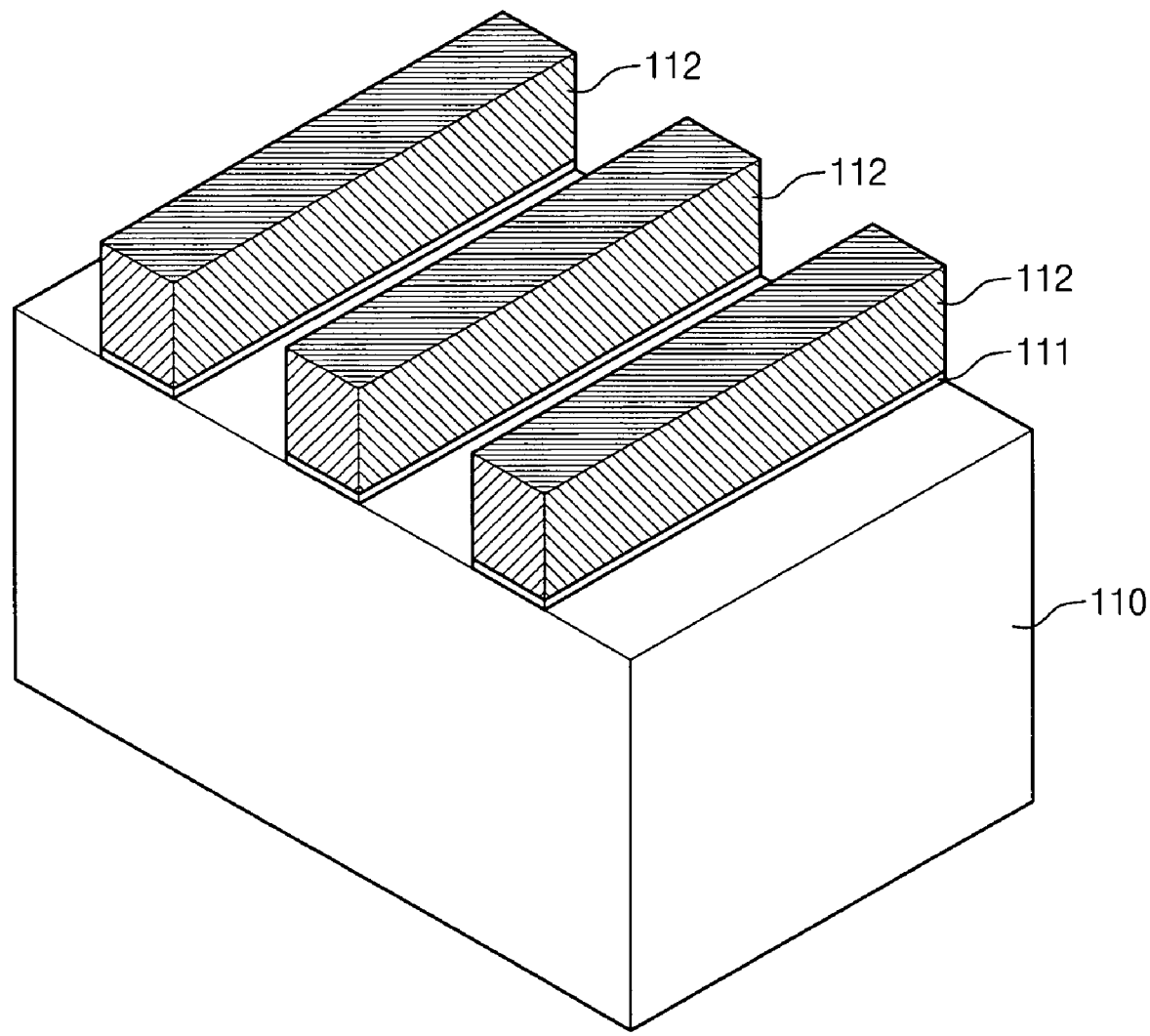
FIGS. 4a-4h illustrate a method of manufacturing a nonvolatile memory structure in accordance with example embodiments.

FIGS. 4a-4h illustrate a method of manufacturing a non-volatile memory structure in accordance with example embodiments. As shown in FIG. 4a, mask patterns 112 may be formed on a semiconductor substrate 110. A pad oxide layer 111 may be formed between the mask patterns 112 and the substrate 110.

In example embodiments, the substrate 110 may be bulk Si, a silicon-on-insulator (SOI), or a stack type and the mask patterns 112 may be made of SiN, SiON, or other suitable material.

Figure 4B:
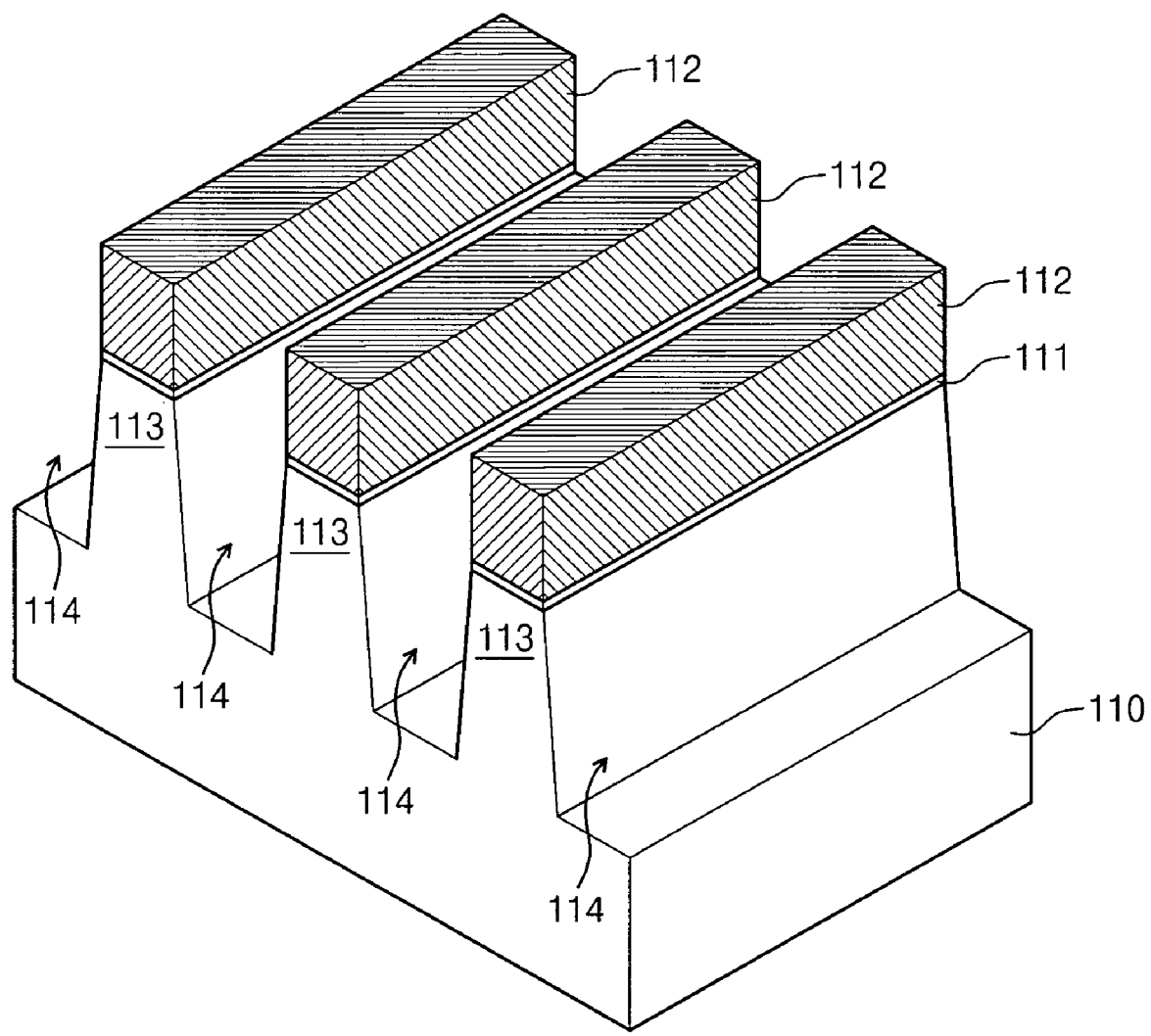

As shown in FIG. 4b, the substrate 110 may be etched to form trenches 114. The trenches 114 may define the active regions 113.

Figure 4C:
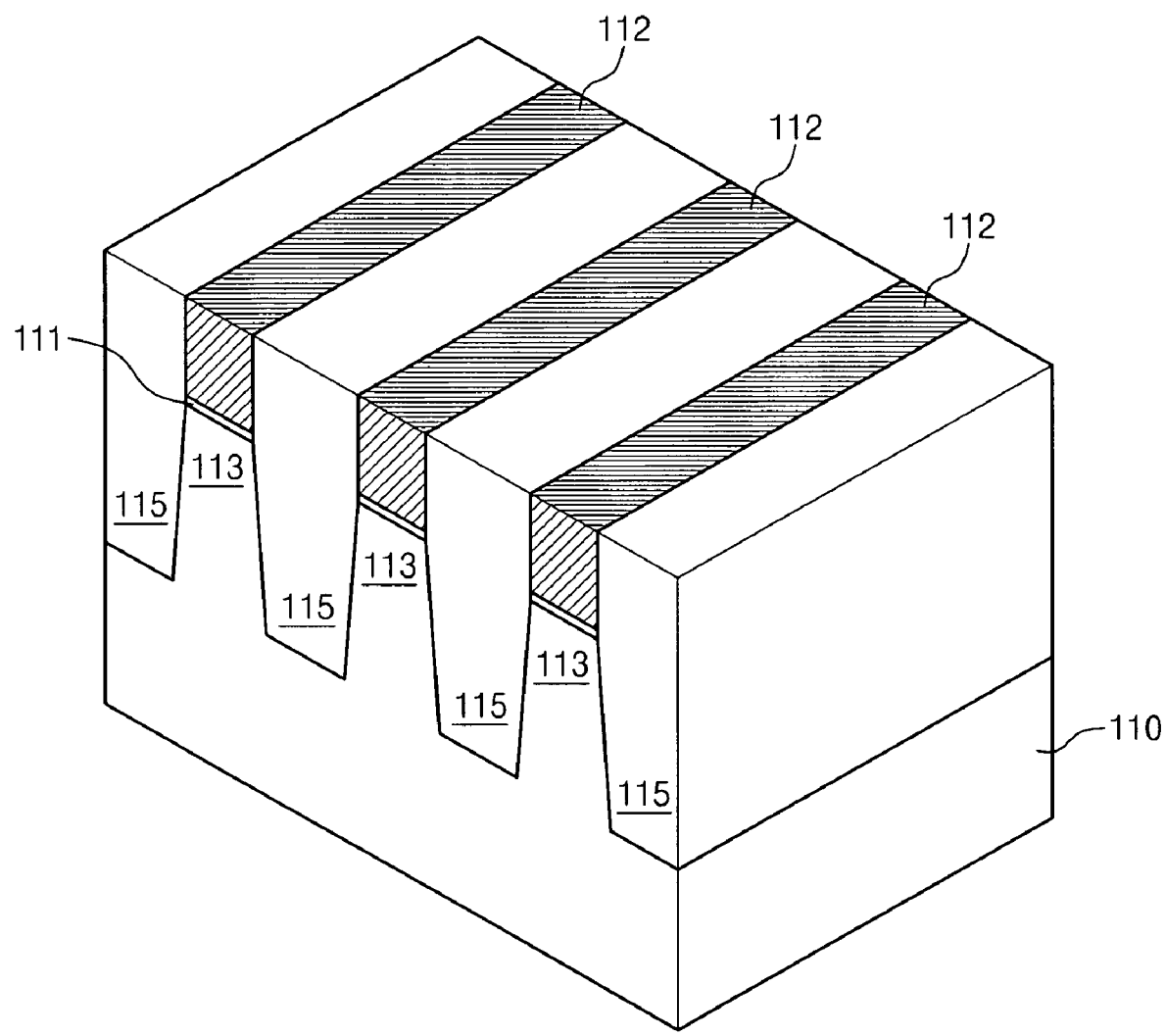

As shown in FIG. 4c, the trenches 114 may be filled with dielectric material to form isolation regions 115. In example embodiments, the dielectric material may be silicon oxide, for example, high density plasma oxide, plasma enhanced oxide (PEOX), or other suitable material. In example embodiments, the dielectric material may be thermal oxide and/or silicon nitride, or other suitable material. As shown in FIG. 4c, the mask patterns 112 and the isolation regions 115 may be planarized, for example, by chemical mechanical polishing (CMP).

Figure 4D:
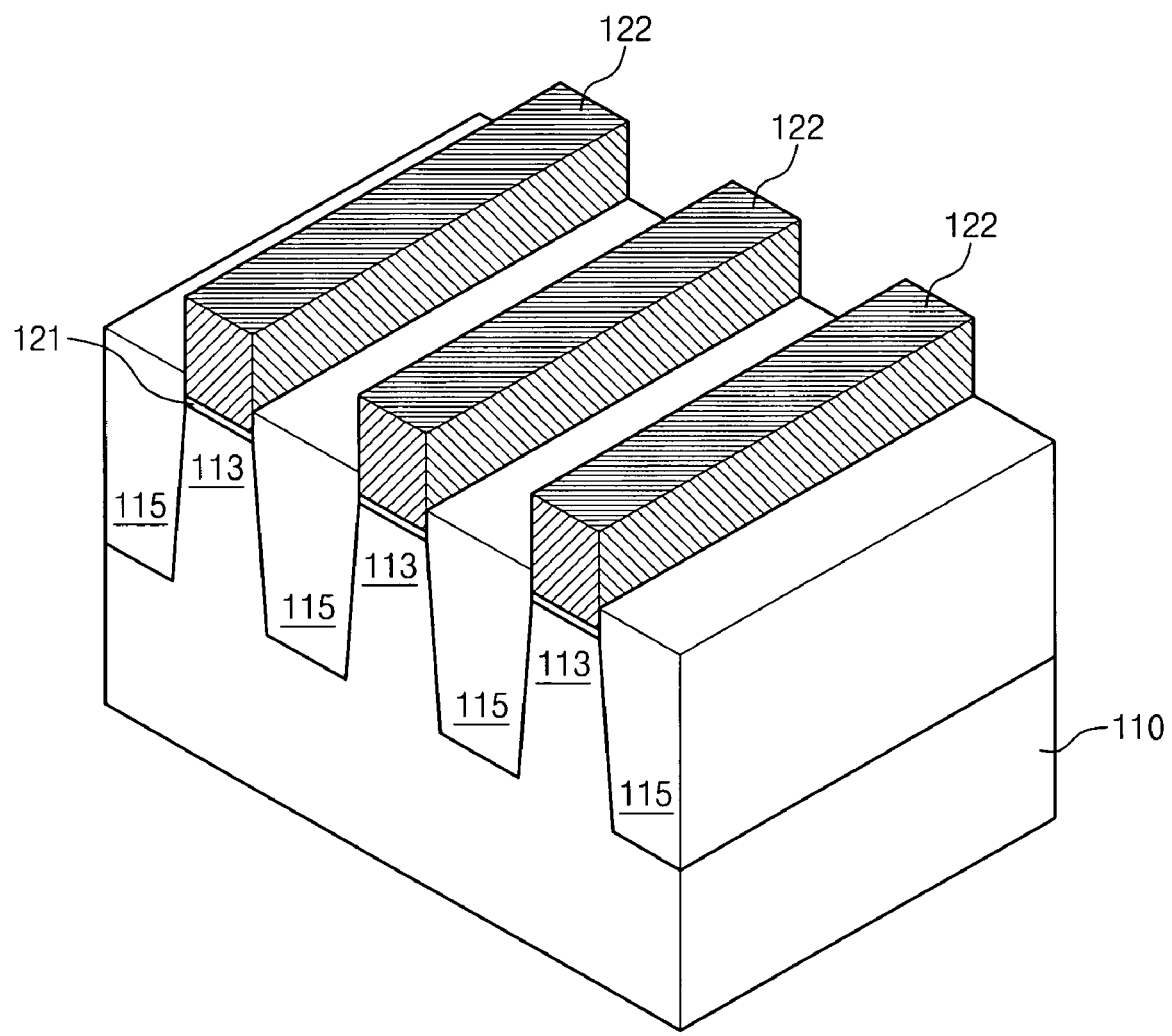

As shown in FIG. 4d, the mask pattern 112 and the pad oxide layer 111 may be removed to expose the active regions 113. In example embodiments, the mask pattern 112 and the pad oxide layer 111 may be removed by an etch process. The etch process may be a dry (anisotropic) etch process or a wet (isotropic) etch process. As shown in FIG. 4d, the remaining pad oxide layer 111 may act as a tunnel insulation layer 121 and the remaining mask patterns 112 may act as charge storage patterns 122. In example embodiments, the charge storage patterns 122 may be a dot layer, charge trap layer, or a floating gate layer. In example embodiments, the dot layer may be made of SiN including conductive dots, for example polysilicon. In example embodiments, the charge trap layer may be made of SiN. In example embodiments, the conductive layer may be a floating gate and may be made of a conductive material, for example, polysilicon.

Figure 4E:
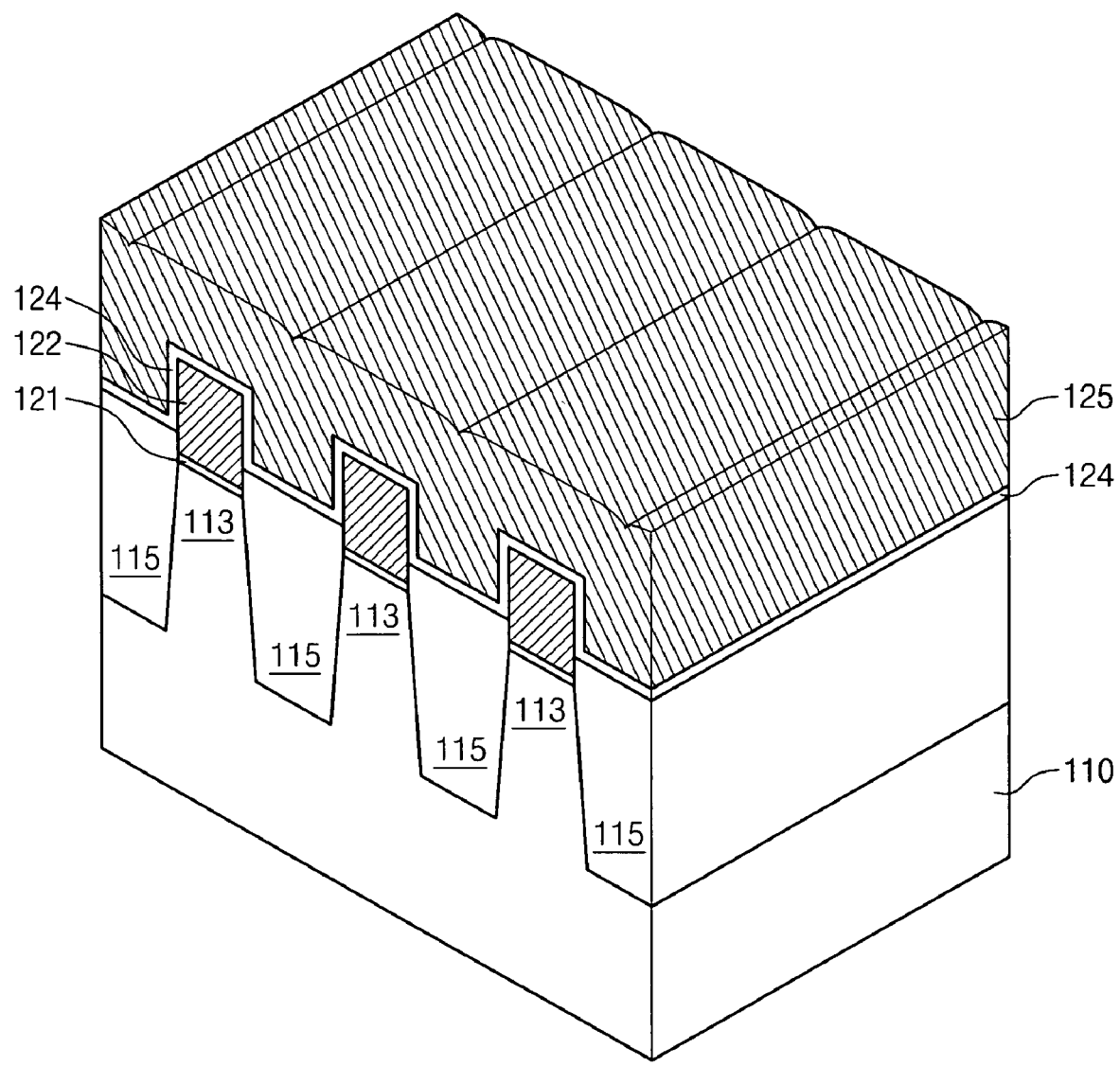

As shown in FIG. 4e, a blocking insulation layer 124 may be formed on the semiconductor substrate 110 including the charge storage patterns 122. A control gate layer 125 may be formed on the blocking insulation layer 124.

In example embodiments, the blocking insulation layer 124 may be made of silicon oxide, silicon nitride, a hafnium aluminate, for example, HfAlO and/or HfAlON, a hafnium silicate, for example, HfSiO and/or HfSiON. In example embodiments, the control gate layer 125 may be made of polysilicon and/or polysilicon in combination with a metal silicide.

Figure 4F:
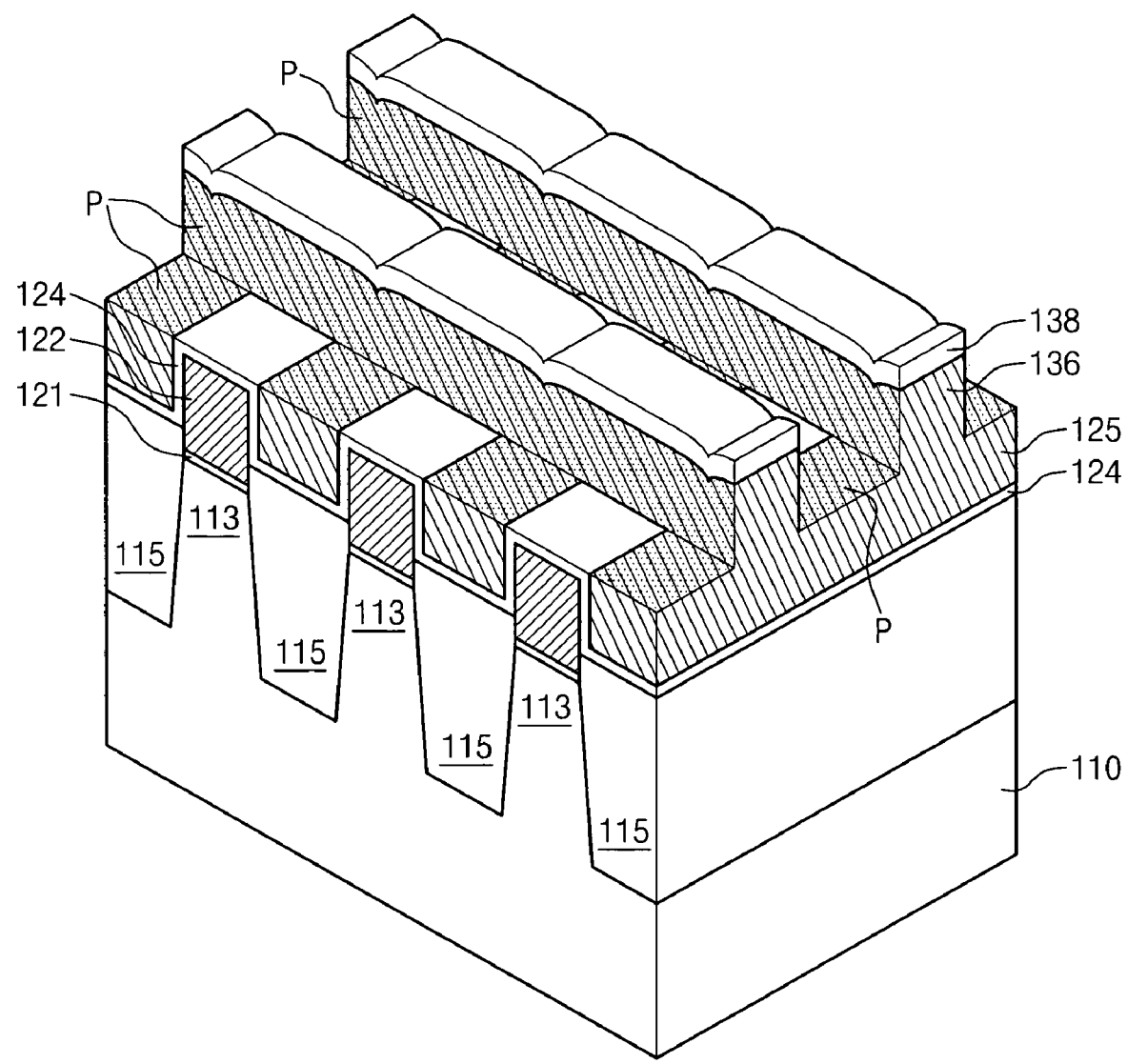

As shown in FIG. 4f, a mask pattern 138 may be formed on the control gate layer 125. The control gate layer 125 may be etched using the mask patterns 138 to form the upper control gate 136.

The control gate layer 125 may be etched in a number of ways. For example, upper and outer portions of control gate layer 125 may be etched away by oxide etching to form the upper control gate 136. The blocking layer 124 and charge storage patterns 122 may be etched away by oxide etching. The lower and inner portions of control gate layer 125 may be etched away by polymer etching to form the lower control gate 137.

If the control gate layer 125 is made of polysilicon, the control gate layer 125 may be etched using a conventional polysilicon etching method until the blocking insulation layer 124 is exposed.

Figure 4G:
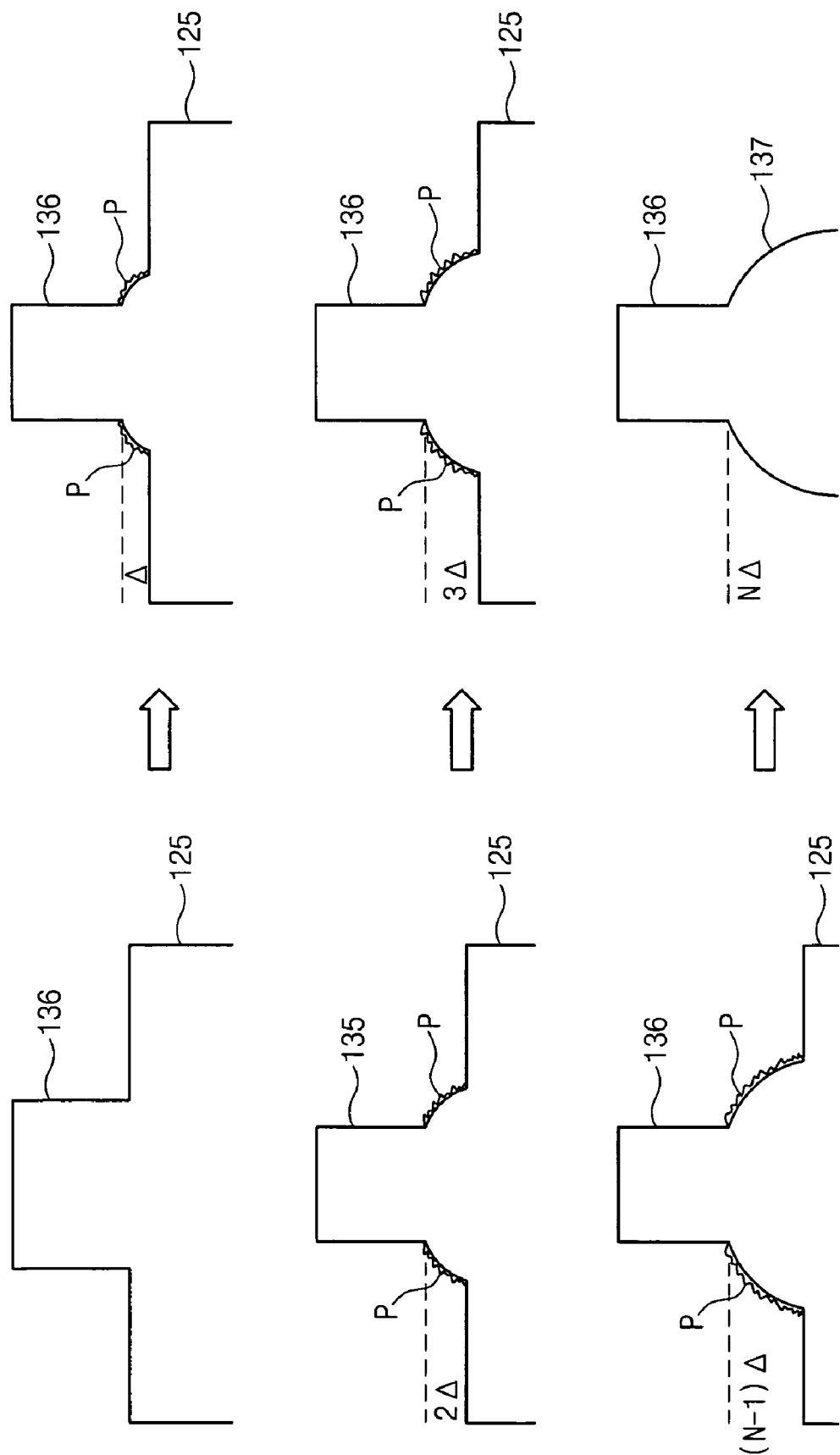

An example of polymer etching is shown in FIG. 4g. An amount of etching polymer P is placed on the control gate layer 125 and etched. The etching polymer (P) may be exposed on a sidewall of the upper control gate 136 and an upper side of the control gate layer 125. The etching polymer P acts a mask to form the small curvature with a height A. This may be repeated N (N>0) times until the desired shape (for example, curved protrusion part 135P of FIG. 3a) is obtained.

Figure 4H:
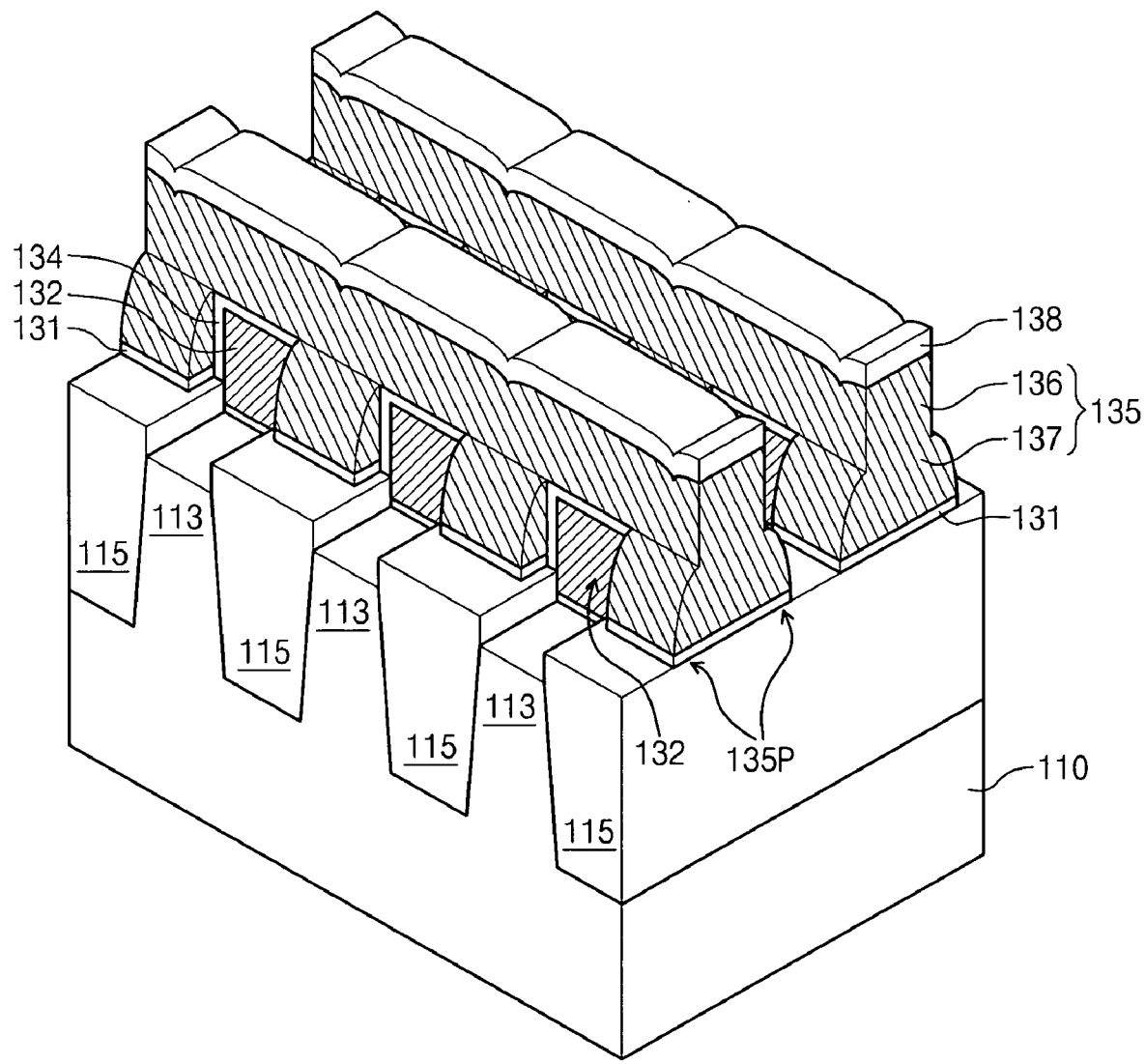

As shown in FIG. 4h, the control gate layer 125 may be etched using mask patterns 138 to form a lower control gate 137. If the control gate layer 125 is made of polysilicon, the control gate layer 125 may be etched by an etching gas including carbon.

As a result, a sidewall of the lower control gate 137 may have a positive gradient, the gradient of the sidewall of the charge storage patterns 132 may be more perpendicular than that of the sidewall of the lower control gate 137, and/or the control gate 135 may include a protrusion part 135p.

In example embodiment, as set forth above, cell interference may be reduced by ensuring a coupling distance (Lc) between charge storage patterns 132 may be larger than a direct geometric distance (Ls) between charge storage patterns 132, Lc>Ls.

In example embodiments, this may be accomplished by ensuring the control gate(s) 135 protrude with respect to the charge storage pattern(s) 132, as shown in FIG. 3a. In example embodiments, this may be accomplished by ensuring the charge storage pattern(s) 132 are recessed with respect to the control gate(s) 135, as shown in FIG. 3a. In example embodiments, the control gate(s) 135 may protrude with respect to the charge storage pattern(s) 132, and the charge storage pattern(s) 132 may be recessed with respect to the control gate(s) 135.

Figure 5A:
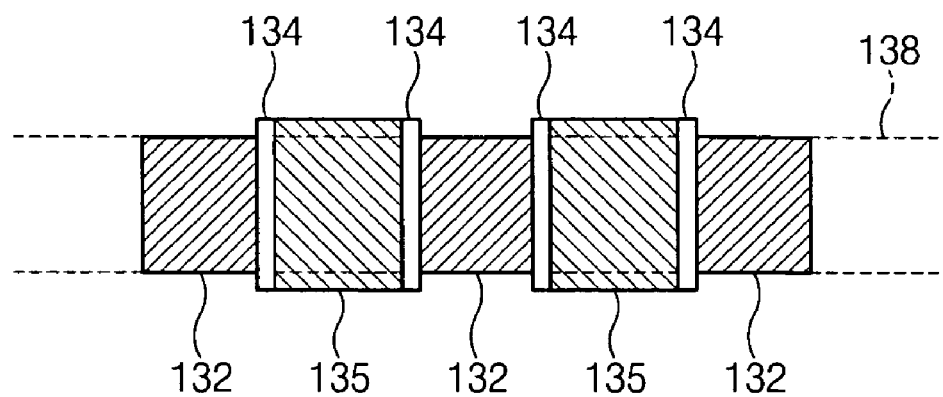
FIG. 5a illustrates control gate(s) protruding with respect to mask pattern(s) in accordance with example embodiments.
Figure 5B:
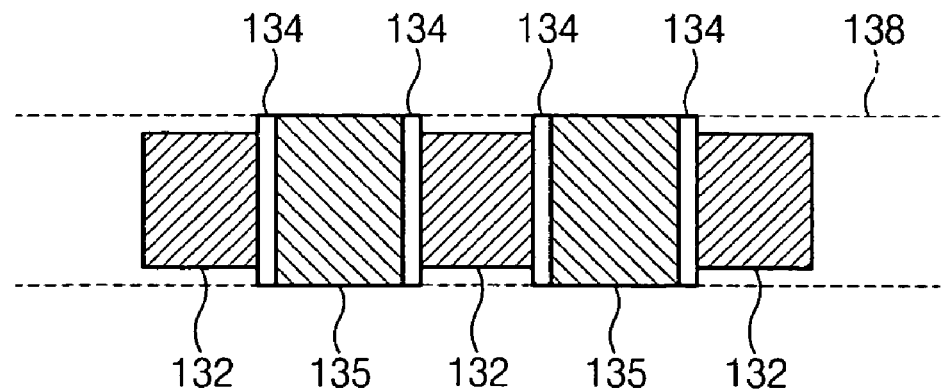
FIG. 5b illustrates charge storage pattern(s) recessed with respect to mask pattern(s) in accordance with example embodiments.

As shown in FIG. 5a, in example embodiments the control gate(s) 135 may protrude with respect to the mask pattern(s) 138. As shown in FIG. 5b, in example embodiments the charge storage pattern(s) 132 may be recessed with respect to the mask pattern(s) 138.

In example embodiments, a sidewall of a portion of a control gate may have a positive gradient. In example embodiments, a sidewall of a portion of a control gate and a sidewall of a portion of a charge storage pattern may have different gradients. In example embodiments, the gradient of the sidewall of a portion of a charge storage pattern may be more perpendicular than that of the sidewall of a portion of a control gate. As is evident from the above, such configurations prevent boundaries of adjacent charge storage patterns from facing each other, which reduces parasitic capacitance.

However, there are a number of other configurations which may achieve this goal. For example, a sidewall of a portion of a control gate may have a greater positive gradient than a sidewall of a charge storage pattern. A sidewall of a portion of a charge storage pattern may have a smaller negative gradient than a sidewall of a control gate. In example embodiments, portions of positive or negative gradients gradient may be curved, straight, and/or stepped.

As set forth above, in example embodiments, the plurality of charge storage patterns may be dot layers, charge trap layers, or conductive layers. For example, the arrangement of charge storage patterns discussed above, are applicable to floating gates and to charge trap layers. The floating gate may be made of a conductive material, for example, polysilicon. The charge trap layer may be made of a non-conductive material, for example, a nitride. Further the nitride may be part of a SONOS arrangement or a TANOS arrangement.

While example embodiments have been particularly shown and described with reference to the example embodiments shown in the drawings, it will be understood by those of ordinary skill in the art that various changes in form and detail may be made therein without departing from the spirit and scope of the following claims.

What is claimed is:

1. A nonvolatile memory structure, comprising:
   a plurality of charge storage patterns, wherein an electrical coupling distance (Lc) between adjacent charge storage patterns is larger than a direct geometric distance (Ls) between adjacent charge storage patterns.

2. The nonvolatile memory structure of claim 1, further comprising:
   a control gate including a plurality of lower control gates between the plurality of charge storage patterns and a plurality of upper control gates connecting the lower control gates above the plurality of charge storage pattern,
   wherein a width of the plurality of lower control gates is larger than that of the plurality of charge storage patterns, and a maximum width of the upper control gate is less than a maximum width of the lower control gate.

3. The nonvolatile memory structure of claim 2, wherein a sidewall of at least one of the plurality of lower control gates has a positive gradient.

4. The nonvolatile memory structure of claim 3, wherein the positive gradient is curved, straight, or stepped.

5. The nonvolatile memory structure of claim 2, wherein a sidewall of at least one of the plurality of lower control gates and a sidewall of at least one of the plurality of charge storage patterns have different gradients.

6. The nonvolatile memory structure of claim 2, further comprising:
   a substrate, wherein an angle between a sidewall of at least one of the plurality of charge storage patterns and a normal vector of the substrate is less than an angle between a sidewall of at least one of the plurality of lower control gates and the normal vector of the substrate.

7. The nonvolatile memory structure of claim 2, wherein a sidewall of at least one of the plurality of lower control gates protrudes with respect to a sidewall of at least one of the plurality of charge storage patterns which prevents the sidewall of the at least one of the plurality of charge storage patterns from facing a sidewall of an adjacent charge storage pattern.

8. The nonvolatile memory structure of claim 7, wherein the sidewall of the at least one of the plurality of lower control gate protrudes with respect to a mask pattern used to form the plurality of upper control gates.

9. The nonvolatile memory structure of claim 7, wherein the lower gate protrusion is of spacer type.

10. The nonvolatile memory structure of claim 2, wherein a sidewall of at least one of the plurality of charge storage patterns is recessed with respect to a sidewall of at least one of the plurality of lower control gates which prevents the sidewall of the at least one of the plurality of charge storage patterns from facing a sidewall of an adjacent charge storage pattern.

11. The nonvolatile memory structure of claim 10, wherein the sidewall of the at least one of the plurality of lower control gate is recessed with respect to a mask pattern used to form the plurality of upper control gates.

12. The nonvolatile memory structure of claim 1, further comprising:
   a substrate including active regions below the plurality of charge storage patterns and isolation regions below and between the plurality of charge storage patterns;
   a tunnel insulation layer on the active regions; and
   a blocking insulation layer on the plurality of charge storage patterns and the isolation regions.

13. The nonvolatile memory structure of claim 1, further comprising:
   a mask layer on the plurality of upper control gates.

14. The nonvolatile memory structure of claim 12, wherein the substrate is a bulk Si substrate, a Silicon-on-Insulator (SOI) substrate or a stacked-type substrate.

15. The nonvolatile memory structure of claim 13, wherein the blocking insulation layer is one of silicon oxide, silicon nitride, Hafnium aluminate, HfAlO, HfAlON, Hafnium silicate, HfSiO, and HfSiON.

16. The nonvolatile memory structure of claim 1, wherein the plurality of charge storage patterns are dot layers, charge trap layers, or conductive layers.

17. The nonvolatile memory structure of claim 2, wherein the plurality of upper and lower control gates are made of polysilicon or polysilicon and a metal silicide.

18. The nonvolatile memory structure of claim 2, wherein a doping concentration of the plurality of charge storage patterns is greater than a doping concentration of the plurality of upper and lower control gates.

19. The nonvolatile memory structure of claim 2, wherein a width of the upper control gate is substantially the same as that of the charge storage pattern.

* * * * *